(12) United States Patent
Ohkubo et al.

(10) Patent No.: US 7,432,545 B2
(45) Date of Patent: Oct. 7, 2008

(54) SEMICONDUCTOR DEVICE

(75) Inventors: Hiroaki Ohkubo, Kanagawa (JP); Noriaki Oda, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/231,767

(22) Filed: Sep. 22, 2005

(65) Prior Publication Data

US 2006/0076596 A1    Apr. 13, 2006

(30) Foreign Application Priority Data

Oct. 8, 2004    (JP) .............................. 2004-296696

(51) Int. Cl.
*H01L 27/108* (2006.01)
*H01L 29/94* (2006.01)
(52) U.S. Cl. ...................................... 257/303; 257/307
(58) Field of Classification Search ................. 257/301, 257/296, 303, 307
See application file for complete search history.

(56) References Cited

U.S. PATENT DOCUMENTS

| | | | |
|---|---|---|---|
| 6,266,226 B1 | 7/2001 | Hayashi | |
| 6,734,489 B2 * | 5/2004 | Morimoto et al. | 257/306 |
| 6,975,500 B2 * | 12/2005 | Hunt et al. | 361/306.3 |
| 7,045,415 B2 * | 5/2006 | Yoshitomi et al. | 438/239 |
| 7,060,557 B1 * | 6/2006 | Zhao et al. | 438/253 |
| 2001/0010955 A1 | 8/2001 | Chen | |
| 2004/0087098 A1 | 5/2004 | Ng et al | |

FOREIGN PATENT DOCUMENTS

| | | |
|---|---|---|
| CN | 1303132 | 7/2001 |
| JP | 2001-237375 | 8/2001 |

\* cited by examiner

*Primary Examiner*—Kiesha L Rose
(74) *Attorney, Agent, or Firm*—Young & Thompson

(57) ABSTRACT

A capacity element with a simple configuration exhibits excellent production reliability. A semiconductor device 100 includes a capacity element consisting of a lower electrode 102, an SiCN film 107 and an upper electrode 113. In an insulating film 101 on a semiconductor substrate is formed a groove, in which the lower electrode 102 is buried. The lower electrode 102 includes two regions, that is, a first lower electrode 103 and a second lower electrode 105, which are separated from each other via the insulating film 101.

13 Claims, 11 Drawing Sheets

102

SEMICONDUCTOR DEVICE

This application is based on Japanese patent application NO.2004-296696, the content of which is incorporated hereinto by reference.

BACKGROUND OF THE INVENTION

1. Field of the Invention

This invention relates to a semiconductor device comprising a capacity element.

2. Description of the Related Art

A conventional semiconductor device comprising a capacity element has been disclosed in, for example, Japanese Laid-open patent publication No. 2001-237375. The application has described an MIM (Metal Insulator Metal) capacitor. There has been also described that an MIM capacitor comprising a Cu electrode is formed by a damascene process, due to which dishing is caused in the Cu electrode.

After intense investigation, the present inventors have found that dishing described in Japanese Laid-open patent publication No. 2001-237375 significantly affects an element forming process particularly when being generated in a lower electrode among electrodes in the MIM capacitor. Dishing in the lower electrode may cause variation in a thickness in a capacitor film formed on the lower electrode, and furthermore, variation in a structure of the lower electrode itself or of an upper electrode formed on the capacitor film.

Therefore, it would be effective to prevent dishing in a lower electrode by the most convenient method for reliably forming a capacity element.

SUMMARY OF THE INVENTION

According to an aspect of this invention, there is provided a semiconductor device comprising:

an insulating film formed on a semiconductor substrate;

a lower electrode buried in a groove formed in the insulating film;

a capacitor film formed on the lower electrode; and an upper electrode formed on the capacitor film, wherein the lower electrode comprises a plurality of electrode regions separated from each other by the insulating film.

According to this invention, in a substrate in-plane direction, a lower electrode buried in a groove formed in an insulating film is divided into a plurality of electrode regions separated from each other by the insulating film, and an insulating film intervenes between electrodes, so that dishing can be prevented during forming the lower electrode. Production of the lower electrode can be, therefore, more reliable. Furthermore, it can result in prevention of deterioration in production reliability for a capacitor film or an upper electrode formed on the lower electrode due to dishing. Thus, this invention provides a simple configuration comprising a capacity element exhibiting improved production reliability.

The expression "a lower electrode comprises a plurality of electrode regions separated from each other by an insulating film" may encompass any configuration where at least part of a lower electrode is divided by the insulating film in a cross-section including the upper surface of the lower electrode. Thus, within the cross-section, at least one part of the periphery of the lower electrode may be opened, or alternatively, within the cross-section, the periphery of the lower electrode may be closed.

According to this invention, a lower electrode comprises a plurality of electrode regions separated from each other by an insulating film, so that there can be provided a capacity element with a simple structure exhibiting improved production reliability.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
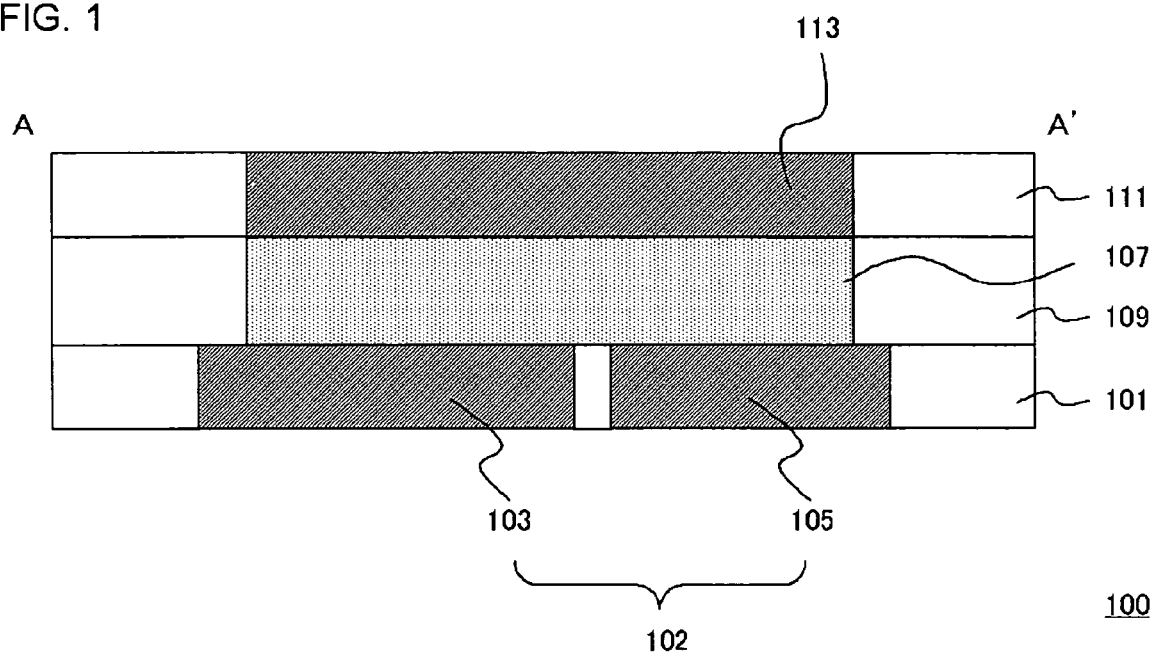
FIG. 1 is a cross-sectional view showing a configuration of a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In a semiconductor device of this invention, the lower electrode may be comprised of first and second electrode assemblies comprising the plurality of parallel electrode regions. Such a configuration can further reliably prevent dishing during forming a lower electrode. Furthermore, the plurality of electrode regions can be arranged in parallel to improve an integration degree of the electrode regions and thus to increase an area of the lower electrode to an area of a region for forming the lower electrode. Thus, reduction in a capacity of a capacity element can be further reliably prevented in comparison with the case where a plate electrode is used as a lower electrode.

In a semiconductor device of this invention, the plurality of electrode regions may be arranged as strips. Therefore, the plurality of electrode regions can be integrated to a further higher density in a substrate in-plane direction. Thus, reduction in a capacity of a capacity element can be further reliably prevented in comparison with the case where a plate electrode is used as a lower electrode.

Herein, a shape of an electrode region constituting a lower electrode is a cross-sectional shape including the upper surface of the lower electrode. In the specification, a strip refers to an elongated rectangular shape which can be integrated in a horizontal direction of a substrate; for example, a stripe.

In a semiconductor device of this invention, the plurality of electrode regions may be arranged as a strip and as a lattice in a substrate in-plane direction. It can further reliably improve an integration degree of the plurality of electrode regions. The plurality of electrode strips can be arranged as a diagonal lattice. Thus, pattern collapse in a layer comprising the lower electrode can be further reliably prevented.

In a semiconductor device of this invention, the electrode regions can be arranged as a comb tooth shape. Thus, an integration degree of the lower electrodes can be improved within a substrate horizontal plane while preventing dishing.

In a semiconductor device of this invention, the electrode regions can be arranged as a comb tooth shape where the ends of the teeth are uneven. Thus, pattern collapse in a layer comprising the lower electrode can be further reliably prevented.

In a semiconductor device of this invention, the lower electrode may comprise first and second electrode regions having a comb tooth shape where the ends of the teeth are uneven, and the insulating film intervening between the first and the second electrode regions may be arranged as a bent shape within the substrate plane.

In a semiconductor device of this invention, the insulating film intervening between the assemblies of first and second electrodes may be arranged as a bent shape within the substrate plane.

Thus, an insulating film separating two adjacent electrode regions may not be aligned in a straight line. Thus, an extension of the insulating film in one direction may be reduced. Therefore, pattern collapse can be further prevented when a distance between two electrode regions is reduced and a width of the insulating film is reduced.

A bent shape herein refers to a bent shape where an insulating film intervening between electrode regions is not extended in a straight line; for example, a regular zigzag shape.

In a semiconductor device of this invention, a minimum distance between an end of one of the electrode regions and an end of another of the electrode regions may be 0.2 μm or less. Thus, reduction in a capacity can be further reliably prevented in comparison with the case where a plate electrode is used as a lower electrode.

A semiconductor device of this invention may further comprise an interconnect buried in an interconnect trench formed in the insulating film and formed in the layer where the lower electrode is formed, wherein the capacitor film is formed over the lower electrode and the interconnect and acts as a diffusion barrier film for the interconnect. Thus, the overall configuration of the semiconductor device may be simplified while preventing interconnect components from diffusing into the insulating film.

A semiconductor device of this invention may further comprise an interconnect buried in an interconnect trench formed in the insulating film and formed in a layer where the lower electrode is formed, and an insulating diffusion barrier film formed over the interconnect and the capacitor film, wherein the upper electrode is formed over the diffusion barrier film. Thus, interconnect components can be further reliably prevented from diffusing into the insulating film.

Any combination of these components as well as expressions of this invention interconverted between a process and a device may be also effective as embodiments of this invention.

For example, in this invention, the lower electrode may be formed by a damascene process. Since a lower electrode is separately formed in this invention, dishing can be prevented in a lower electrode in a capacity element formed by a damascene process, resulting in improved production reliability for the capacity element.

In this invention, a minimum distance between the plurality of adjacent regions via the insulating film may be 0.2 μm or less. In this invention, a minimum distance between adjacent teeth in a comb tooth shape may be 0.2 μm or less.

In this invention, a plurality of electrodes with a strip shape may be electrically connected in the insulating film. In this invention, a plurality of electrodes having a strip shape may be connected via another layer.

In this invention, the interconnect may be a copper interconnect. In this invention, the interconnect may be formed by the process for forming the lower electrode. In this invention, the interconnect may be formed by a damascene process.

In this invention, the capacitor film may comprise an SiCN or SiN film. In this invention, the diffusion barrier film may comprise an SiCN or SiN film.

Embodiments of this invention will be more specifically described with reference to the drawings. In all figures, a common component is indicated by the same symbol and its description is not represented as appropriate.

Embodiment 1

FIG. 1 is a cross-sectional view showing a configuration of a semiconductor device according to this embodiment. In a semiconductor device 100 shown in FIG. 1, on a semiconductor substrate (not shown) are sequentially formed an insulating film 101, an insulating film 109 and an insulating film 111.

In the insulating film 101, there is formed a groove, in which a lower electrode 102 is buried. The lower electrode 102 comprises two regions, a first lower electrode 103 and a second lower electrode 105, which are separated from each other by the insulating film 101. There is formed an SiCN film 107 adjacent to the lower electrode 102. The SiCN film 107 is buried in the insulating film 109 formed in contact with the insulating film 101. On the SiCN film 107, there is formed an upper electrode 113. The upper electrode 113 is buried in a groove formed in an insulating film 111 formed in contact with the insulating film 109.

The semiconductor device 100 comprises a capacity element consisting of the lower electrode 102, the SiCN film 107 and the upper electrode 113.

There will be described a case where the lower electrode 102 is a Cu electrode formed by a damascene process. Specifically, there will be described a case where the upper electrode 113 is a TiN film.

Figure 2:
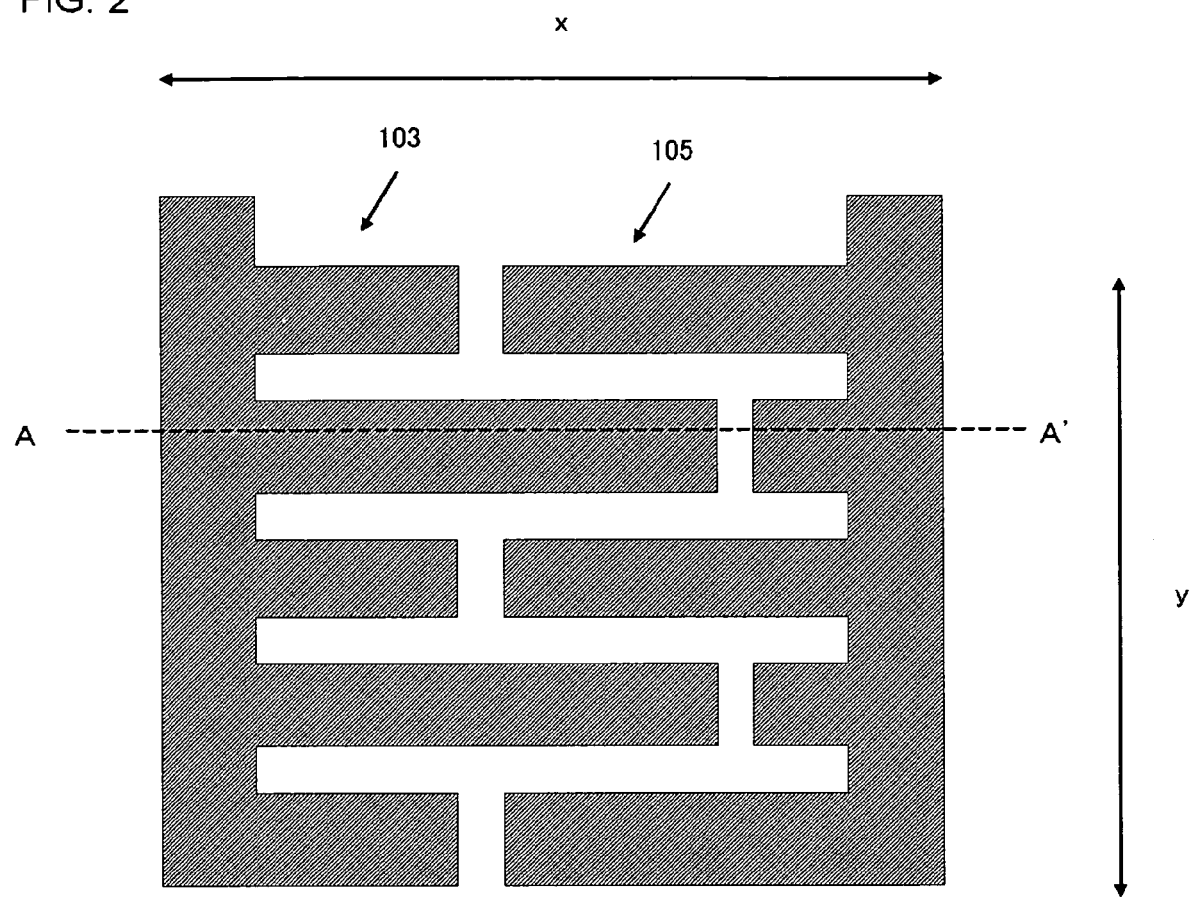
FIG. 2 is a plan view showing a configuration of a lower electrode in a semiconductor device according to an embodiment.

FIG. 2 is a plan view showing a configuration of the lower electrode 102 shown in FIG. 1. FIG. 2 shows a shape of the lower electrode 102 in a horizontal plane of a semiconductor substrate. FIG. 1 described above corresponds to the cross-sectional view taken on A-A' in FIG. 2.

In FIG. 2, in both first lower electrode 103 and second lower electrode 105, a planar shape of the upper surface of the lower electrode 102 is a comb tooth shape in which shorter and longer teeth are alternately arranged so that the tooth ends are uneven. The first lower electrodes 103 and the second lower electrodes 105 are adjacent via the insulating film 101 such that their teeth mutually face to each other. A planar shape of the insulating film 101 intervening between the first lower electrode 103 and the second lower electrode 105 has a zigzag bent shape.

In each of the first lower electrode 103 and the second lower electrode 105 in the cross-section including the upper surface of the lower electrode 102, a minimum distance between comb teeth constituting each electrode may be, for example, 0.2 μm or less, preferably 0.1 μm or less. Furthermore, a minimum distance between the first lower electrode 103 and the second lower electrode 105 in the above cross-section may be also, for example, 0.2 μm or less, preferably 0.1 μm or less. Thus, it can adequately improve a rate of the area of the lower electrode 102 to the area of the region for forming the lower electrode in the substrate horizontal plane. Reduction in a capacity can be minimized in comparison with the use of one planar lower electrode with the equal area of the region for forming the lower electrode. Furthermore, the lower limit of a distance between comb teeth constituting each electrode can be appropriately selected as long as it is adequate to avoid pattern collapse of the insulating film 101.

Although being not shown in FIG. 2, the first lower electrode 103 and the second lower electrode 105 are connected, for example, within the insulating film 101 to be equipotential. Alternatively, the first lower electrode 103 and the second lower electrode 105 may be connected via a layer other than the insulating film 101 to be equipotential.

There will be described a process for manufacturing the semiconductor device 100 shown in FIG. 1. FIGS. 3A to 3C, 4A to 4C and 5A to 5C are cross-sectional views illustrating the steps of manufacturing the semiconductor device 100.

Figure 3A:
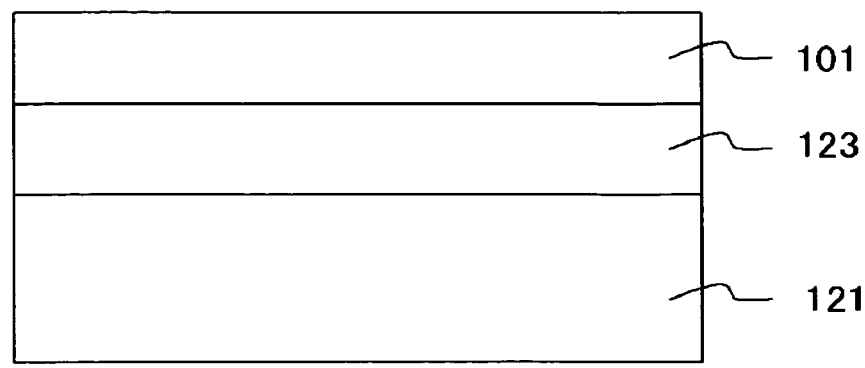
FIGS. 3A to 3C are cross-sectional views showing a process for manufacturing a semiconductor device according to an embodiment.
Figure 3B:
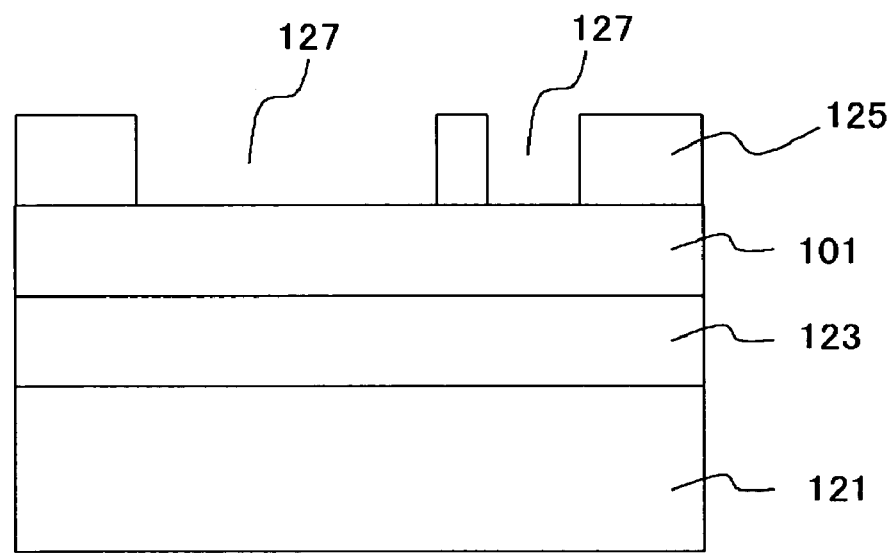

First, as shown in FIG. 3A, a base insulating film 123 is formed on a silicon substrate 121 with a semiconductor element. This embodiment will be described in terms of the case where a capacity element is formed just above the base insulating film 123. On the base insulating film 123 is deposited an $SiO_2$ film as the insulating film 101 by plasma CVD. Next, a mask 125 is formed on the insulating film 101, and then an opening 127 is formed in the mask 125 by photolithography such that the insulating film 101 is exposed at the position where the lower electrode 102 is to be formed (FIG. 3B).

Figure 3C:
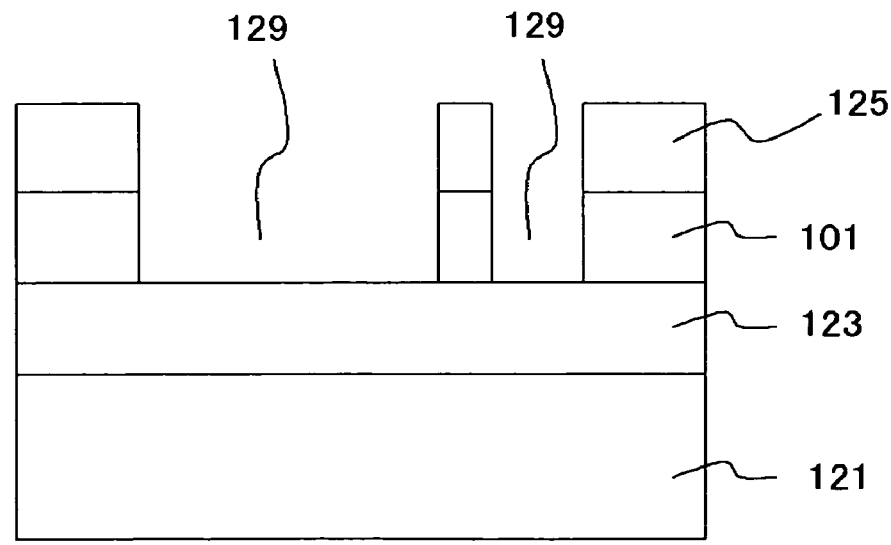
Figure 4A:
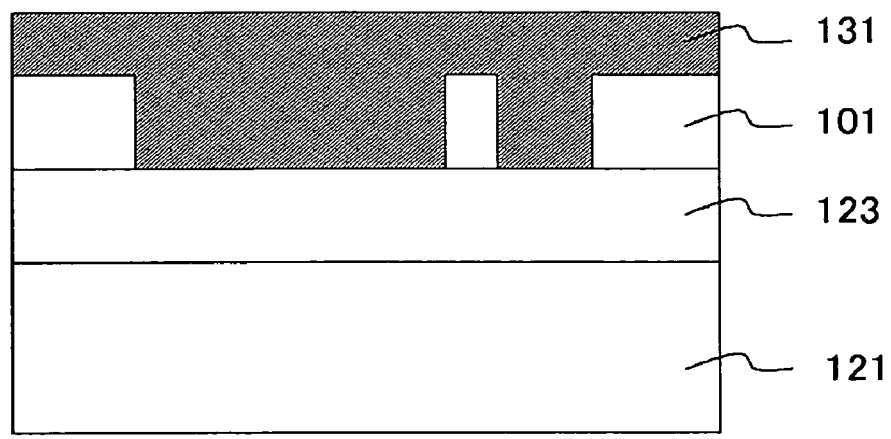
FIGS. 4A to 4C are cross-sectional views showing a process for manufacturing a semiconductor device according to an embodiment.
Figure 4B:
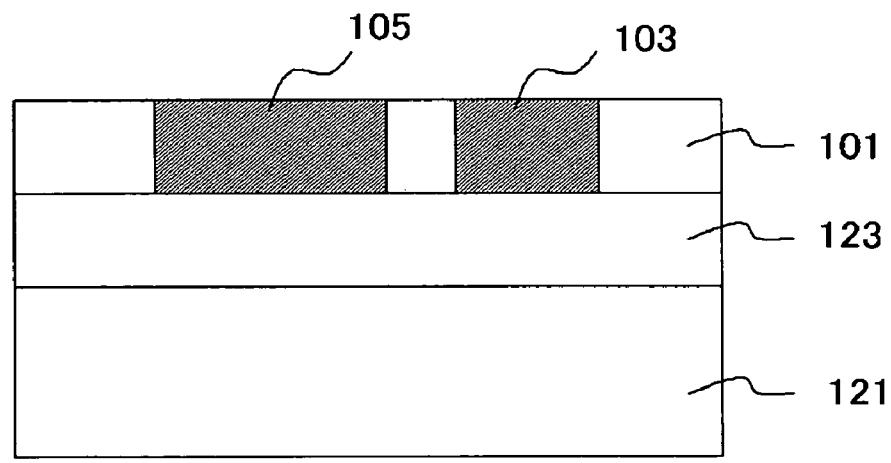

Then, the exposed part in the insulating film 101 was selectively removed by dry etching to form a concave 129 as a groove in the insulating film 101 (FIG. 3C). After removing the mask 125, a Ta/TaN film (not shown) acting as a diffusion barrier film is deposited over the whole surface of the silicon substrate 121. Then, over the whole surface of the silicon substrate 121, a Cu film 131 is deposited such that the concave 129 is buried (FIG. 4A). Subsequently, the Cu film 131 formed outside of the concave 129 is removed by CMP (chemical mechanical polishing), to form the first lower electrode 103 and the second lower electrode 105 (FIG. 4B).

Figure 4C:
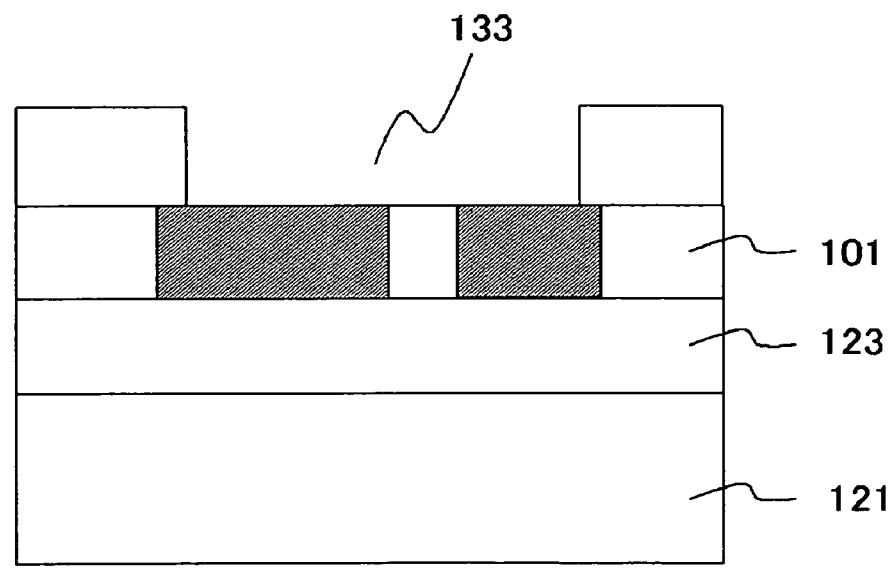
Figure 5A:
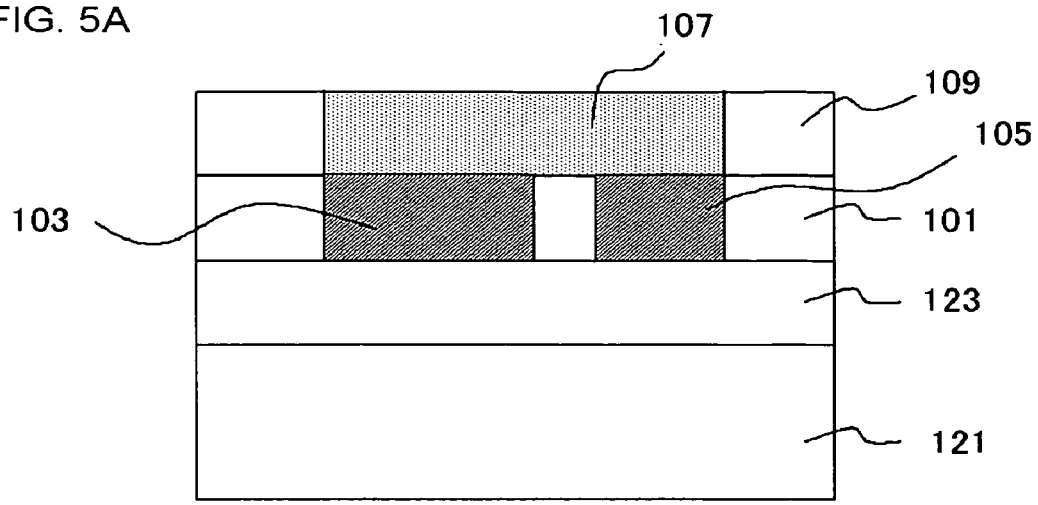
FIGS. 5A to 5C are cross-sectional views showing a process for manufacturing a semiconductor device according to an embodiment.
Figure 5B:
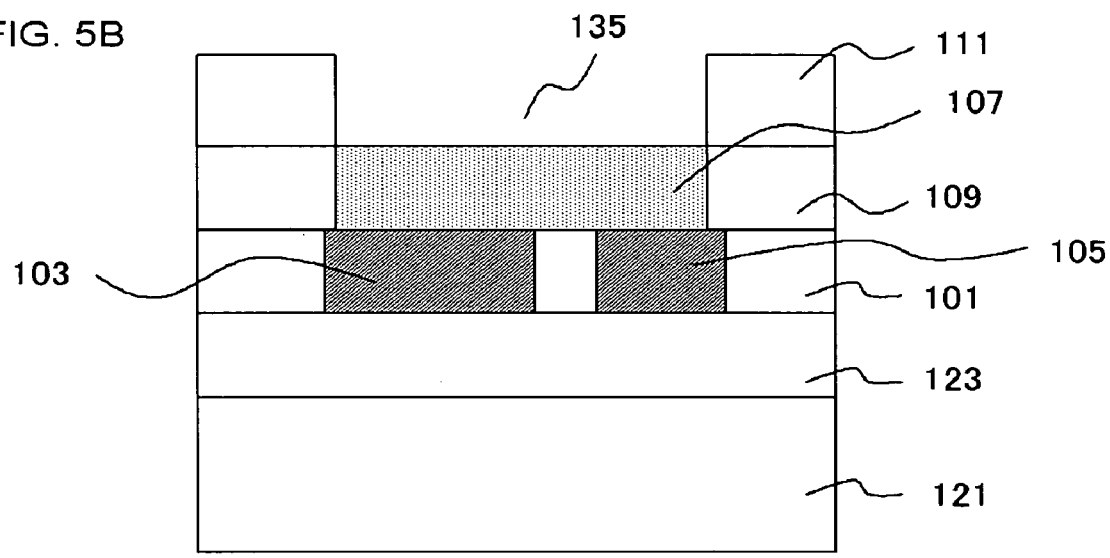

Next, on the insulating film 101 is deposited an $SiO_2$ film as the insulating film 109. As described with reference to FIGS. 3B and 3C, a concave 133 for forming a capacitor film is formed in the insulating film 109 on the lower electrode 102 (FIG. 4C). Subsequently, over the whole surface of the silicon substrate 121, an SiCN film 107 acting as a capacitor film is formed such that the concave 133 is buried. Then, the SiCN film 107 formed outside of the concave 133 is removed by CMP (FIG. 5A).

Figure 5C:
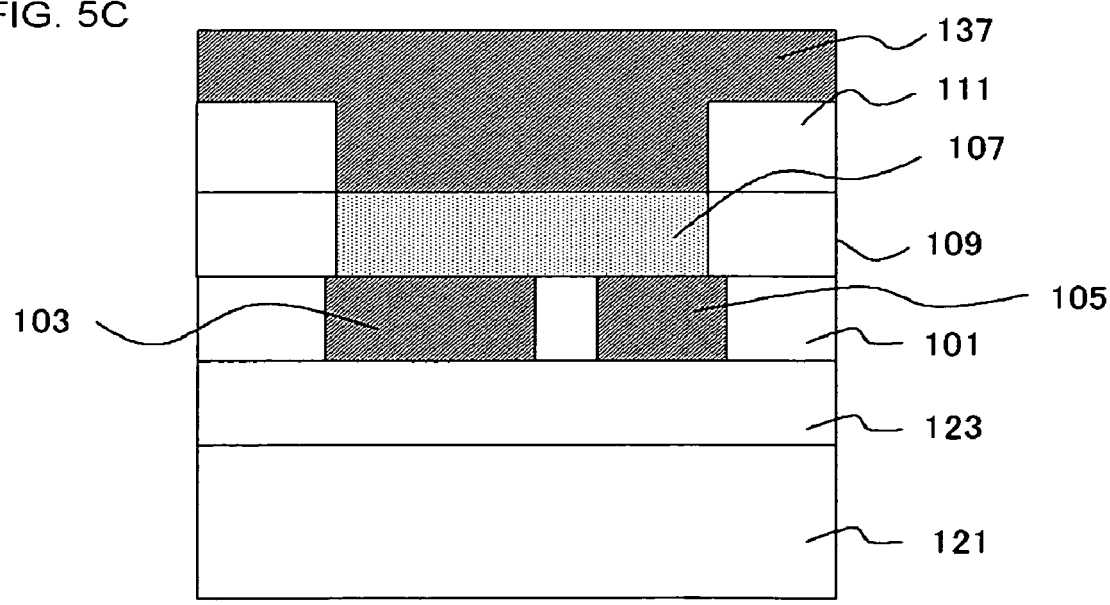

Then, an $SiO_2$ film as the insulating film 111 is formed on the insulating film 109 and a concave 135 is formed in the insulating film 111 over the SiCN film 107 as described above (FIG. 5B). Next, over the whole surface of the silicon substrate 121, a TiN film 137 is formed by sputtering such that the concave 135 is buried (FIG. 5C). Subsequently, the TiN film 137 formed outside of the concave 135 is removed by CMP to form the upper electrode 113. Thus, a semiconductor device 100 (FIG. 1) is provided.

Next, there will be described effects of the semiconductor device 100 shown in FIG. 1.

In the semiconductor device 100 shown in FIG. 1, the lower electrode 102 consists of two regions, namely, the first lower electrode 103 and the second lower electrode 105, which are separated from each other by the insulating film 101. The configuration can minimize dishing in the upper surface of the Cu film 131 during CMP (FIGS. 4A and 4B) of the Cu film 131, in comparison with the case where the lower electrode 102 is one plate. Therefore, it can minimize deterioration in reliability for capacity element production due to dishing, and give a capacity element with excellent production reliability.

In the semiconductor device 100, both first lower electrode 103 and second lower electrode 105 have a comb-tooth planar shape and the insulating film 101 intervening between them is arranged in a zigzag manner. If the insulating films 101 intervening between the first lower electrode 103 and the second lower electrode 105 are arranged in a straight line, their aspect ratio may be so increased that a resist as the mask 125 formed on the insulating film 101 as a sidewall of the concave 129 formed as described with reference to FIG. 3C might fall. Thus, the insulating films 101 can be arranged in a bent line within the substrate plane, that is, their cross-sectional shape can be a zigzag line as is in this embodiment, so that resist falling described above and associated pattern collapse can be prevented. Thus, pattern collapse in the insulating film 101 separating the lower electrode 102 and the lower electrode 102 from each other is prevented, resulting in improved production reliability.

In the semiconductor device 100, the first lower electrode 103 and the second lower electrode 105 have a comb-tooth cross-sectional shape. Therefore, the insulating film 101 remains in a tooth extension direction and in a direction perpendicular to the extension direction. Thus, pattern collapse can be further reliably prevented in comparison with a configuration where it remains in one direction.

Japanese Laid-open patent publication No. 2001-237375 has described that dishing in a first electrode can be prevented by forming the first electrode having a shape other than a rectangle in a silicon substrate and forming a first diffusion barrier film made of a metal nitride on the upper surface of the first electrode. However, in this configuration, the first electrode is also formed under the first diffusion barrier film corresponding to the lower electrode 102 in FIG. 1. Furthermore, a second electrode having a shape other than a rectangle is formed over a second diffusion barrier film made of a metal nitride corresponding to the upper electrode 113 in FIG. 1. Thus, the device configuration is complicated. Furthermore, manufacturing this device requires additional steps of engraving the first electrode on a silicon substrate, forming the first diffusion barrier film on the first electrode, and forming the second diffusion barrier film under the second electrode. Thus, the device described in Japanese Laid-open patent publication No. 2001-237375 requires a complicated manufacturing process.

In contrast, in the semiconductor device 100 shown in FIG. 1, the lower electrode 102 susceptible to dishing during a damascene step is divided into two regions while the upper electrode 113 is an electrode on one plate. Thus, there is provided a simple configuration manufactured by a simple process which can ensure an adequate capacity while preventing dishing in the lower electrode 102.

Figure 6:
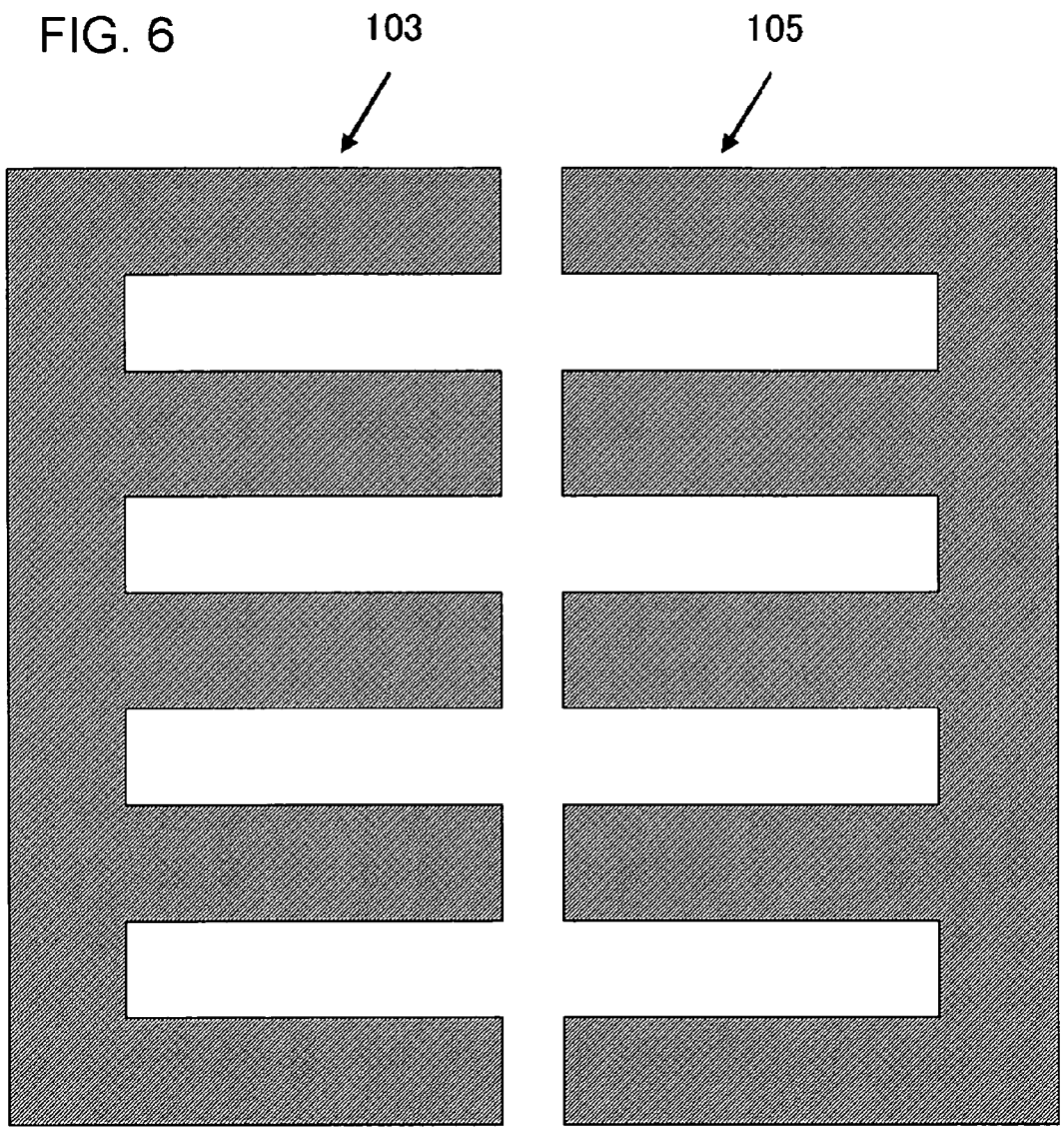
FIG. 6 is a plan view showing a configuration of a lower electrode in a semiconductor device according to an embodiment.
Figure 7:
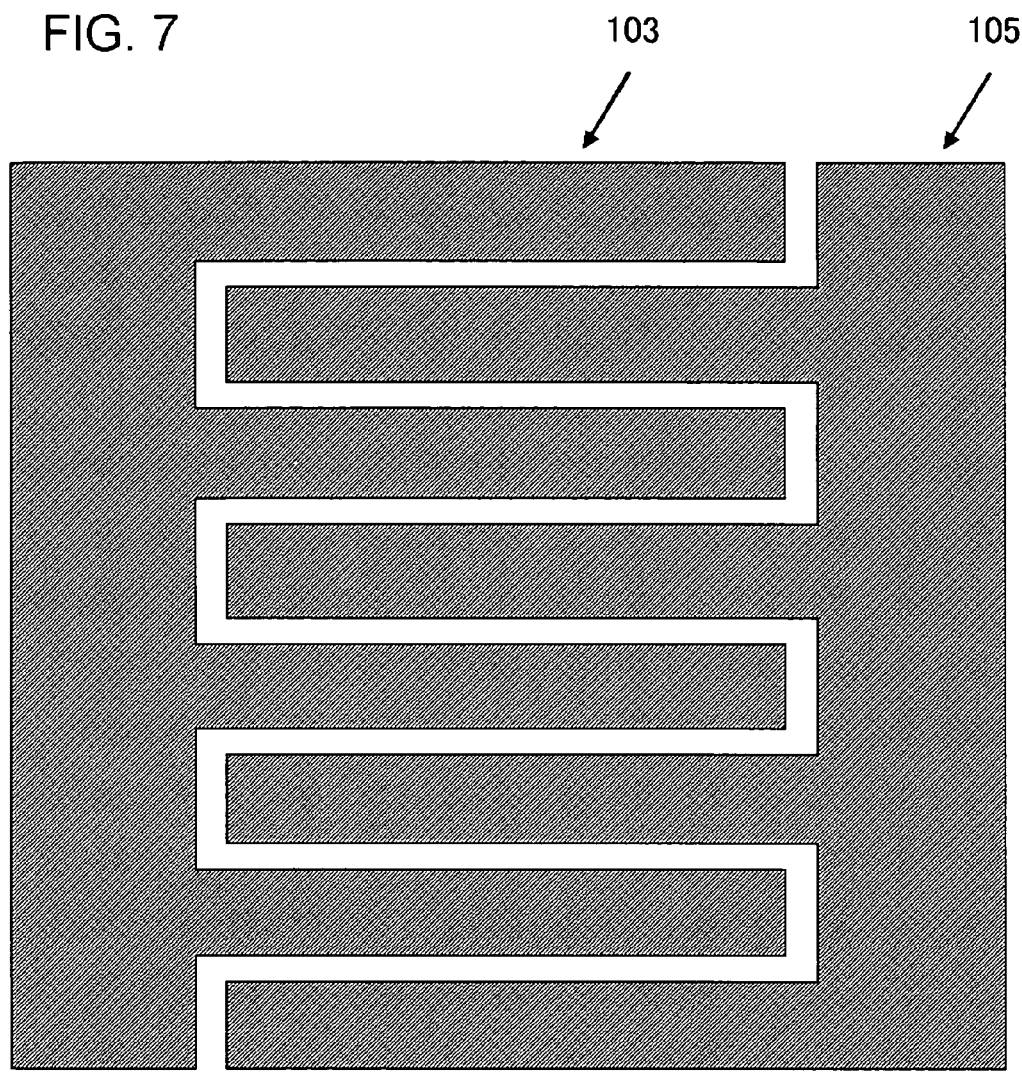
FIG. 7 is a plan view showing a configuration of a lower electrode in a semiconductor device according to an embodiment.

In the semiconductor device 100 shown in FIG. 1, the lower electrode 102 can have a shape other than that shown in FIG. 2. FIGS. 6 and 7 show other examples of a planar shape of the lower electrode 102.

The basic configuration in FIG. 6 is as illustrated in FIG. 2, except that in FIG. 6, the first lower electrode 103 and the second lower electrode 105 have a comb tooth shape with equal length of teeth at least in a cross-section including the upper surface of the lower electrode 102, and the first lower electrode 103 and the second lower electrode 105 are adjacent via the insulating film 101 in a manner that their teeth face to each other. Again, in this configuration, the first lower electrode 103 and the second lower electrode 105 are separated from each other by the insulating film 101, so that dishing during forming the lower electrode 102 can be prevented. Although the insulating films 101 intervening between the first lower electrode 103 and the second lower electrode 105 are arranged as a straight line in a direction perpendicular to the extension direction of the comb teeth in FIG. 6, they may be arranged as a non-straight line (zigzag line) as shown in FIG. 2, so that pattern collapse in the insulating film 101 can be more reliably prevented.

FIG. 7 shows another example where both first lower electrode 103 and second lower electrode 105 have a comb tooth shape. In contrast to FIGS. 2 and 6, FIG. 7 shows a configuration where the ends of the comb teeth in the first lower electrode 103 do not face the ends of the comb teeth in the second lower electrode 105, specifically two comb teeth are alternately arranged via the insulating film 101 so that between comb teeth in one electrode, there is inserted a comb tooth in the other electrode. Again, in this configuration, the insulating films 101 intervening between the first lower electrode 103 and the second lower electrode 105 has a cross-sectional shape where they are arranged in a non-straight line along the direction of electrode arrangement as shown in FIG. 2, so that even when the insulating film 101 between adjacent electrodes is narrow, resist falling therein can be prevented. Thus, pattern collapse in the insulating film 101 can be further reliably prevented.

Figure 13:
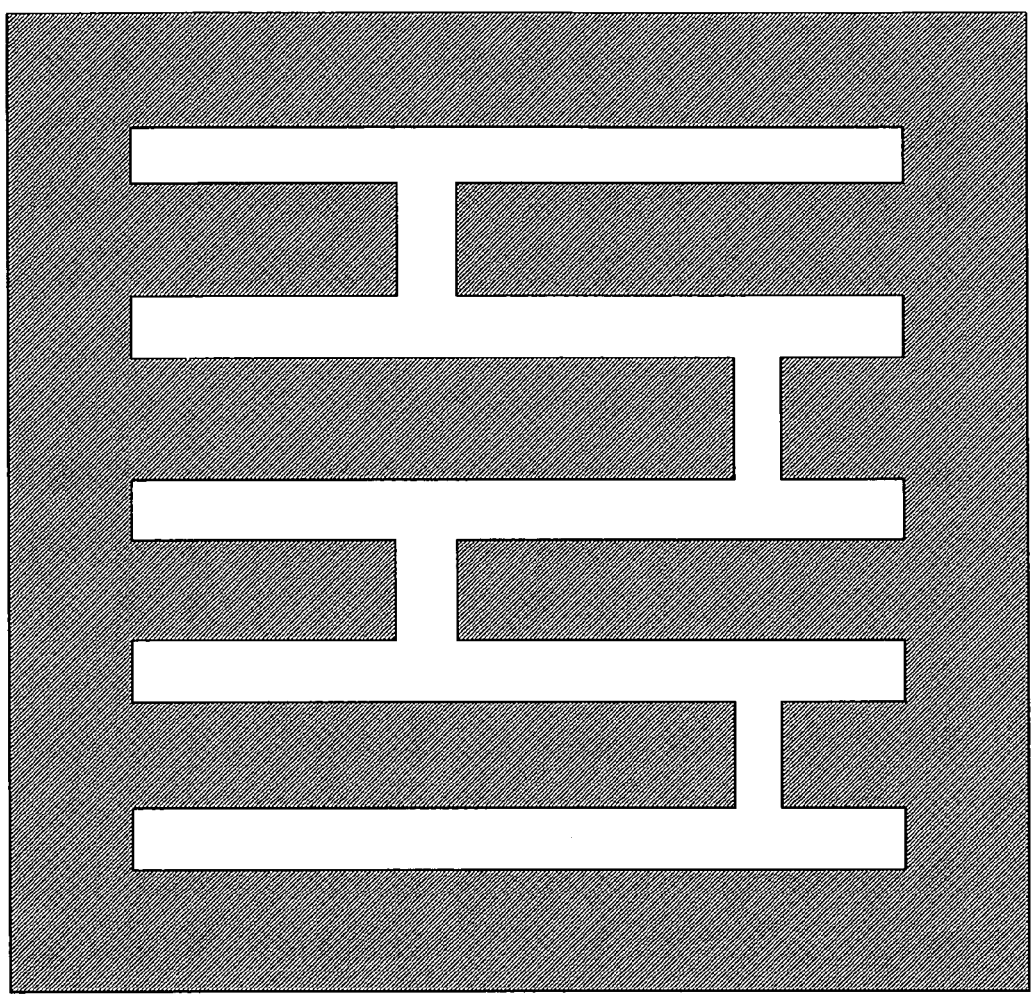
FIG. 13 is a plan view showing a configuration of a lower electrode in a semiconductor device according to an embodiment.

FIG. 13 shows a planar shape of the lower electrode 102 in which the first lower electrode 103 and the second lower electrode 105 shown in FIG. 2 are formed as a continuously integrated part. The term "continuously integrated part" means that they are molded as a continuous unit. It is preferably a single member without a joint. In FIG. 13, the insulating film 101 dividing the lower electrode 102 into a plurality of regions has a planar shape as a ladder. As shown in FIG. 13, any cross-sectional shape including the upper surface of the lower electrode 102 may be used as long as the regions are separated by the insulating film 101 at least in the cross-section, without being limited to a configuration where in the cross-section, the lower electrode 102 consists of a plurality of members or where at least part of its periphery is opened, and a configuration where the periphery is closed may be used.

The following embodiments will be described, focusing on differences from Embodiment 1.

Embodiment 2

In the first semiconductor device 100 (FIG. 1) described in Embodiment 1, the first lower electrode 103 and the second lower electrode 105 constituting the lower electrode 102 has a comb tooth shape, but each of the first lower electrode 103 and the second lower electrode 105 may be an electrode assembly consisting of an assembly of a plurality of electrodes. For example, they may be connected to a connection electrode buried in an underlying insulating film via a connection plug buried in an insulating film below the insulating film 101, to ensure an equipotential.

Figure 8:
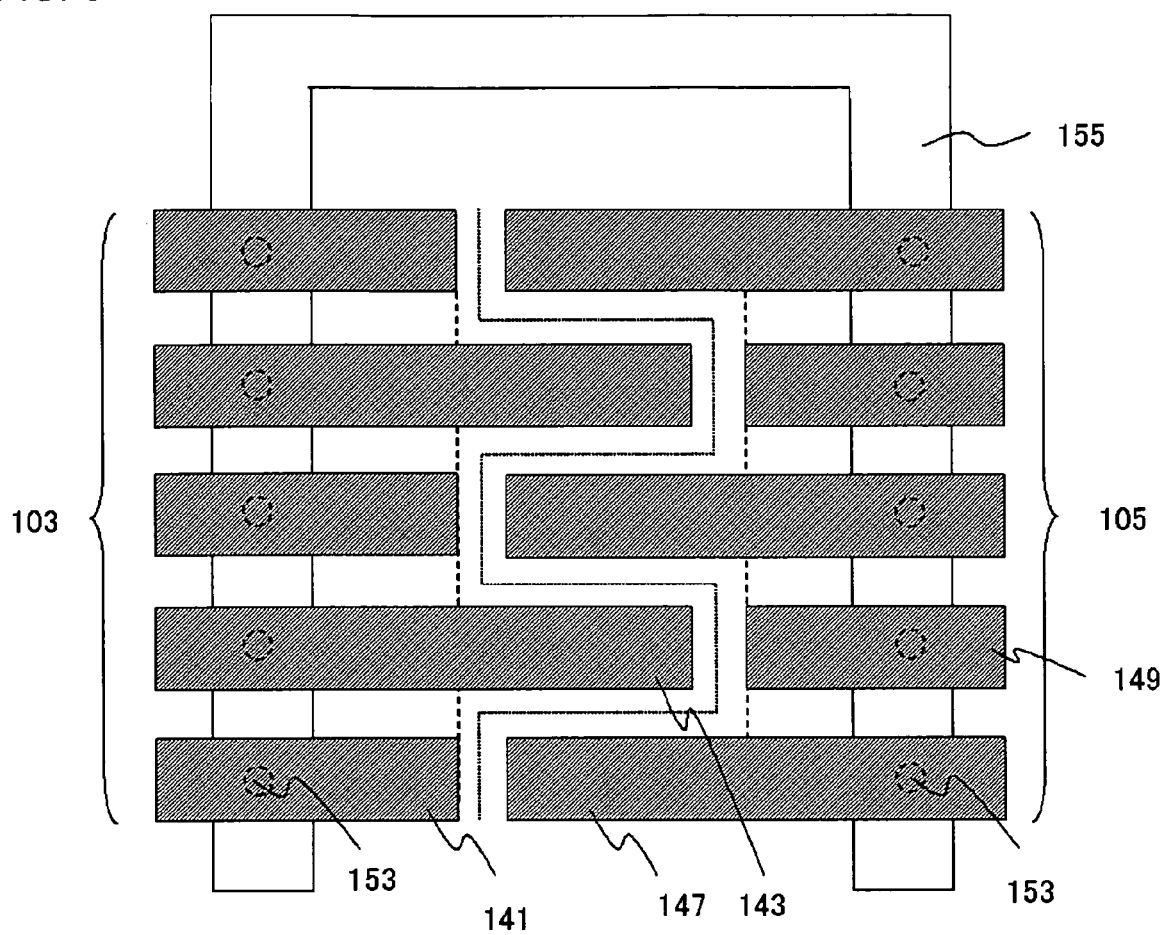
FIG. 8 is a plan view showing a configuration of a lower electrode in a semiconductor device according to an embodiment.

FIG. 8 shows a planar shape of the lower electrode 102 according to this invention. FIG. 8 illustrates a configuration where the first lower electrode 103 is an electrode assembly consisting of a plurality of electrodes 141 and a plurality of electrodes 143 and the second lower electrode 105 is an electrode assembly consisting of a plurality of electrode 147 and a plurality of electrode 149. The electrodes 141, 143, 147 and 149 have a cross-sectional shape of a strip.

The electrode assembly constituting the first lower electrode 103 has a configuration where the electrodes 141 and the electrodes 143 are alternately arranged and are parallel. The electrode assembly constituting the second lower electrode 105 has a configuration where the electrodes 147 and the electrode 149 are alternately arranged and parallel. The electrode 141 and the electrode 149 have the same cross-sectional shape, and have a smaller width in the longitudinal direction of the strip (strip length) than the electrode 143 and the electrode 147. The electrode 143 and the electrode 147 also have the same cross-sectional shape. Furthermore, the electrodes 141 and the electrodes 147 are adjacent via the insulating film 101, in a manner that their ends face each other while the electrodes 143 and the electrodes 149 are adjacent via the insulating film 101, in a manner that their ends face each other. In the region separating the first lower electrode 103 from the second lower electrode 105, the insulating films 101 are arranged as a bent shape within a substrate plane, as indicated by a dotted line in FIG. 8, that is, their planar shape is a zigzag line.

A plurality of these strip electrodes are connected via a layer other than the insulating film 101. In FIG. 8, a conductive plug 153 acting as a connection plug is connected to each of the electrodes 141, 143, 147 and 149. The conductive plug 153 is, for example, buried in an insulating film just below the insulating film 101. The conductive plug 153 connected to each electrode is connected to a connection electrode 155 buried in a concave as a groove formed in an underlying insulating film. Thus, all of the electrodes constituting the first lower electrode 103 and the second lower electrode 105 are maintained to be equipotential.

This configuration also provide effects comparable to those of the lower electrode 102 shown in FIG. 2.

Figure 9:
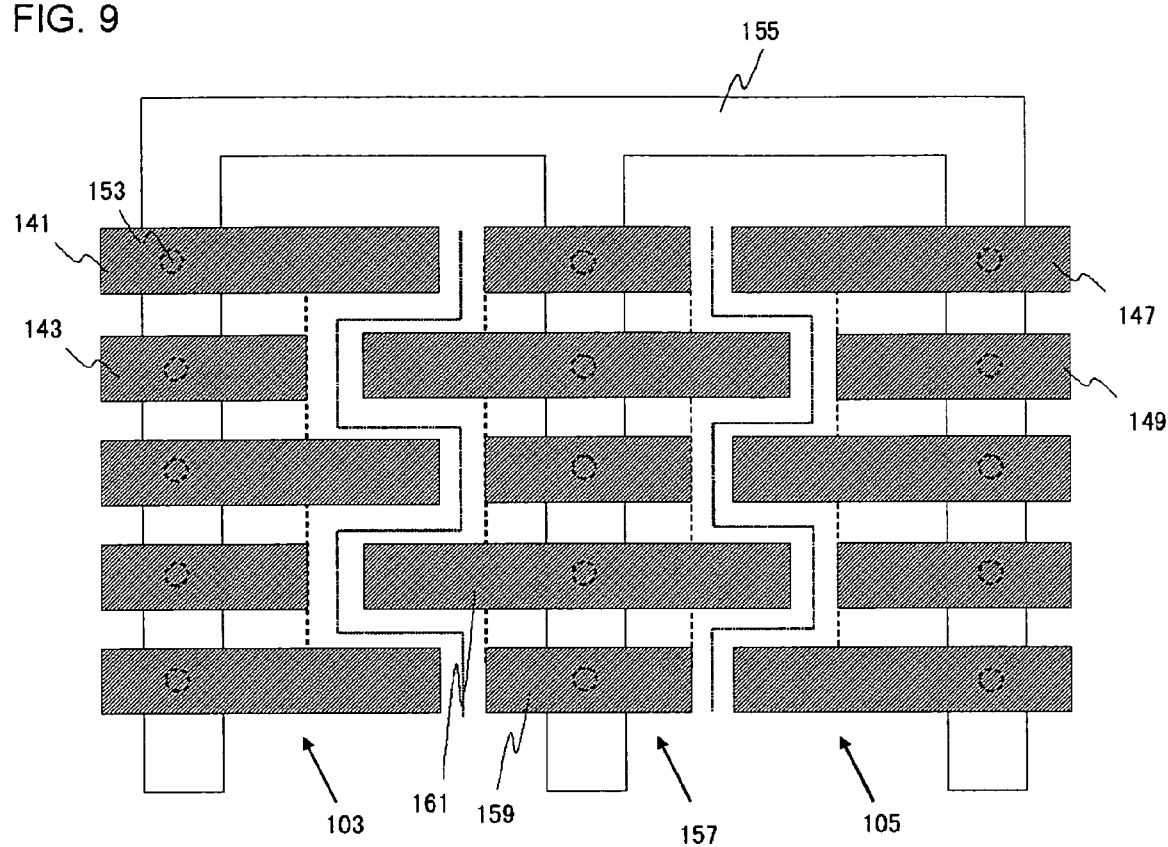
FIG. 9 is a plan view showing a configuration of a lower electrode in a semiconductor device according to an embodiment.

FIG. 9 shows a modification of the configuration in FIG. 8. In FIG. 9, a third lower electrode 157 is further formed between the first lower electrode 103 and the second lower electrode 105. The third lower electrode 157 is an electrode assembly comprising a plurality of strip electrodes 159 and a plurality of strip electrodes 161. The electrodes 159 and 161 are alternately arranged and parallel to each other. The electrode 159 has a substantially equal length to the electrode 143 and the electrode 149, while the electrode 161 is longer than the electrode 159 and has a substantially equal length to the electrode 141 and the electrode 147.

The lower electrode 102 shown in FIG. 9 has a shape of a long strip electrode which is divided into three electrodes, specifically into the electrodes 141, 159 and 147 or into the electrodes 143, 161 and 149 by the insulating film 101.

The configuration shown in FIG. 9 can also prevent dishing during forming the lower electrode 102 as in the configuration in FIG. 8. Furthermore, the plurality of electrodes (electrodes 141, 143, 147, 149, 159 and 161) constituting the lower electrode 102 are arranged as a diagonal lattice. Thus, an integration degree of the electrodes can be further reliably improved. Furthermore, in a configuration where an inter-electrode distance is small and the insulating film 101 intervening between the electrodes is narrow, pattern collapse in the insulating film 101 can be more reliably prevented.

In FIGS. 8 and 9, the materials for the conductive plug 153 and the connection electrode 155 may be appropriately selected; for example, a metal such as Cu.

In FIGS. 8 and 9, there is shown a configuration where a plurality of electrodes are connected in a lower layer in the lower electrode 102, but a plurality of electrodes may be connected in an upper layer in the lower electrode 102.

In FIG. 9, there is shown a configuration where strip electrodes constituting the lower electrode 102 are arranged as a diagonal lattice within the substrate plane, but the strip electrodes may be arranged as another type of lattice such as a square lattice.

Embodiment 3

Although the capacitor film was an SiCN film 107 in the semiconductor device 100 shown in FIG. 1, the capacitor film may be a layered film of a plurality of insulating films.

Figure 10:
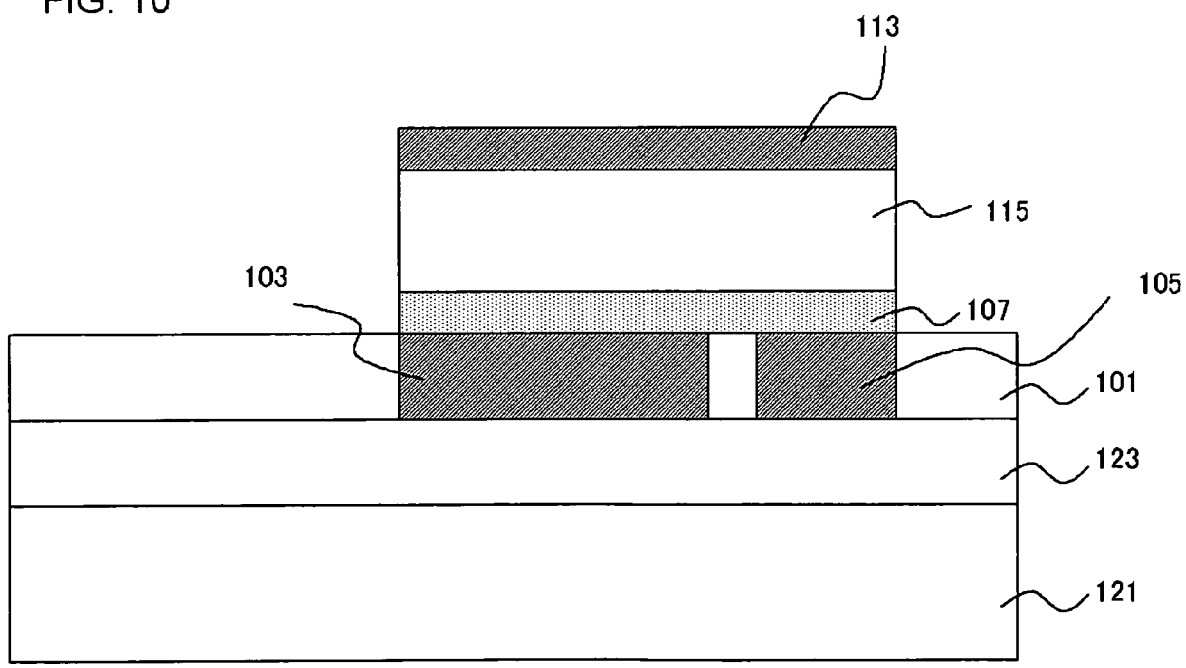
FIG. 10 is a cross-sectional view schematically showing a configuration of a semiconductor device according to an embodiment.

FIG. 10 is a cross-sectional view illustrating a configuration of a semiconductor device according to this embodiment. The semiconductor device shown in FIG. 10 has the basic configuration as shown in FIG. 1, except that an SiN film 115 is formed in the contact with the SiCN film 107 contacting with the lower electrode 102 and the upper electrode 113 is formed in contact with the SiN film 115. Forming the SiN film 115 can further improve a capacity of the capacity element.

Figure 11:
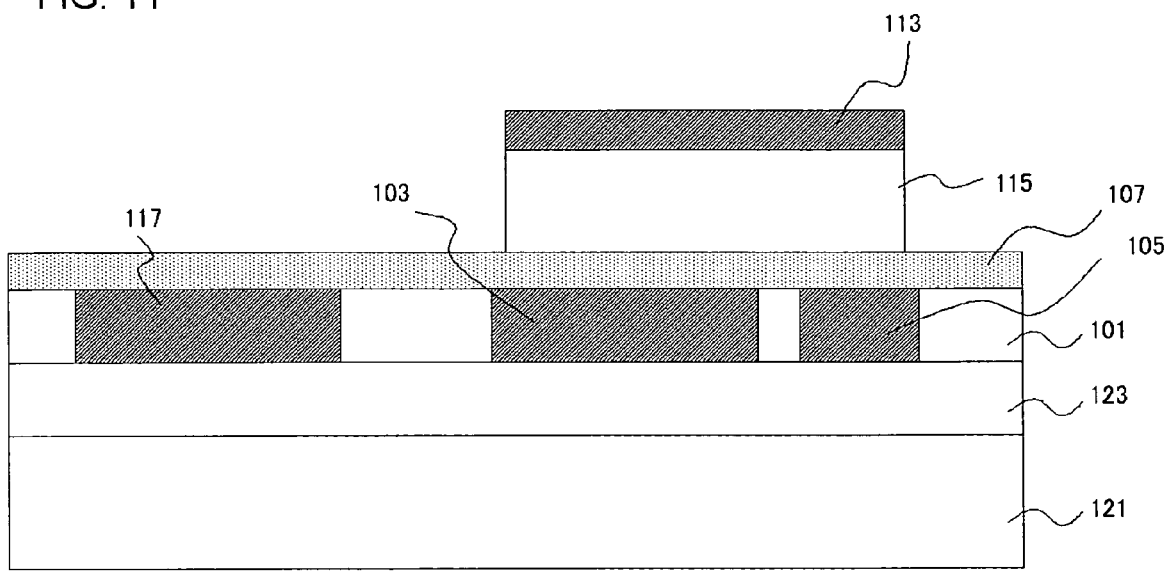
FIG. 11 is a cross-sectional view schematically showing a configuration of a semiconductor device according to an embodiment.
Figure 12:
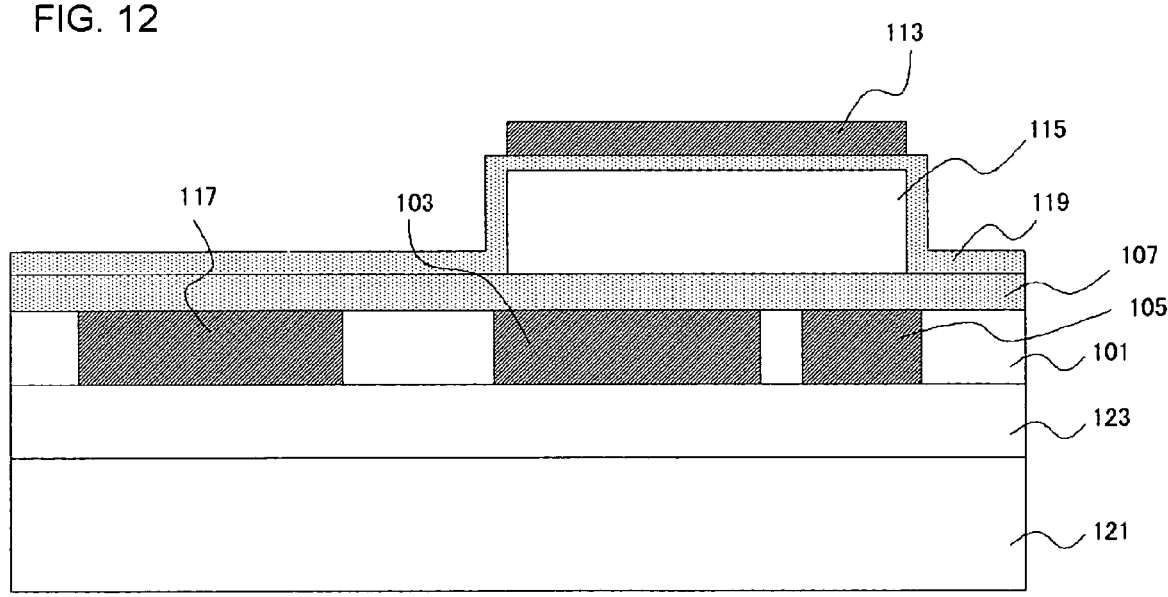
FIG. 12 is a cross-sectional view schematically showing a configuration of a semiconductor device according to an embodiment.

FIG. 10 and FIGS. 11 and 12 described later show a configuration where a base insulating film 123 is formed on the surface of a silicon substrate 121 comprising a semiconductor device element and an insulating film 101 is formed in contact with the base insulating film 123. There are, however, no particular restrictions to a position where a capacity element is formed; for example, it may be formed in a further upper layer.

In the semiconductor devices described in the above embodiments, the SiCN film 107 is used as a capacitor film. The capacitor film may, therefore, also act as a diffusion barrier film for another copper interconnect in the layer.

FIG. 11 is a cross-sectional view of a semiconductor device where a Cu interconnect 117 is formed in the insulating film 101 and an SiCN film 107 is formed over the Cu interconnect 117 and the lower electrode 102. The Cu interconnect 117 is formed by a damascene process during the step of forming the lower electrode 102. The SiCN film 107 may have a thickness of, for example, 50 nm.

In the semiconductor device shown in FIG. 11, the SiCN film 107 acts not only as the capacitor film in the capacity element but also as a diffusion barrier film for and the Cu interconnect 117. Thus, the overall configuration of the device may be simplified while reliably preventing diffusion of Cu in the Cu interconnect 117.

FIG. 12 shows the semiconductor device in FIG. 11, where an SiCN film 119 is formed over the Cu interconnect 117 and the SiN film 115. The SiCN film 119 is in contact with the SiCN film 107 over the Cu interconnect 117. The SiCN film 119 is in contact not only with the SiN film 115 on the SiCN film 107 in the region for forming a capacity element but also with the upper electrode 113 above.

According to this configuration, a capacity of the capacity element can be further reliably improved while further reliably preventing Cu in the Cu interconnect 117 from diffusing into the insulating film. In FIG. 12, the SiCN film 107 has, for example, a thickness of 30 nm while the SiCN film 119 has, for example, a thickness of 20 nm.

Although some embodiments of this invention have been described with reference to the drawings, these embodiments are only illustrative, and, in addition to those described above, various configurations may be employed.

For example, although the capacitor film formed over the upper part of the lower electrode 102 and contacting with the lower electrode 102 is the SiCN film 107 in the above embodiments, the capacitor film may be, in addition to an SiCN film, an SiN film or the like.

Although the insulating films 101, 109 and 111 are $SiO_2$ films in the above embodiments, these insulating films may be not limited to an $SiO_2$ film, but may be, for example, a low dielectric-constant film having a specific dielectric constant of 3.5 or less. Specific examples of such a low dielectric-constant film include an SiOC film, a hydrogenated polysiloxane film, a methylpolysiloxane film, a methyl hydrogen polysiloxane film and these which have been made porous. An organic polymer may be used as a low dielectric-constant film. The low dielectric-constant film may be a film comprising Si, O and H as constituent elements. The low dielectric-constant film may be a film comprising Si, C, O and H as constituent elements. Even when using a low dielectric-constant film, reliability in capacity element production may be improved by dividing the lower electrode 102 into a plurality of regions.

EXAMPLES

The semiconductor device 100 shown in FIG. 1 was prepared. The lower electrode 102 had a planar shape shown in FIG. 2. In FIG. 2, a length (x) of the comb tooth electrode constituting the lower electrode 102 in the extension direction was 10 μm while a length (y) of the strip electrode in the arrangement direction was 10 μm. In the semiconductor device 100, the upper electrode 113 had a size of 10 μm×10 μm.

A distance between the ends of the comb-tooth electrodes constituting the lower electrode 102 and a distance between comb teeth (hereinafter, collectively referred to as a "line distance") were varied from 0.1 μm, 0.2 μm to 0.5 μm. In all cases, dishing was not observed in the lower electrode 102 and pattern collapse was not observed in the insulating film 101.

When a distance between the electrode ends and a distance between comb teeth were 0.1 μm, 0.2 μm and 0.5 μm, reduction in a capacity was 7%, 26% and 53%, respectively, from a capacity for the lower electrode 102 as one plane with a size of 10 μm×10 μm.

It is apparent that the present invention is not limited to the above embodiment, that may be modified and changed without departing from the scope and spirit of the invention.

What is claimed is:

1. A semiconductor device comprising:
an insulating film formed on a semiconductor substrate;
an interconnect buried in an interconnect trench formed in said insulating film;

a lower electrode buried in a groove formed in said insulating film, said lower electrode comprising plural electrode regions separated from each other by said insulating film, said lower electrode being formed in a same layer as said interconnect;

a capacitor film formed on and in physical contact with said lower electrode; and an upper electrode formed on said capacitor film, wherein said upper electrode covers said plural electrode regions, wherein said upper electrode comprises as a main component a material different from a metal which comprises a main component of said interconnect, wherein a top surface of said capacitor film contacts a single said upper electrode and a bottom surface of said capacitor film contacts said plural electrode regions, and wherein said capacitor film has a substantially flat shape.

2. The semiconductor device according to claim 1, wherein said lower electrode is comprised of first and second electrode assemblies comprising said plurality of electrode regions that are disposed in parallel.

3. The semiconductor device according to claim 2, wherein said plurality of electrode regions are arranged as strips.

4. The semiconductor device according to claim 3, wherein said plurality of electrode regions are arranged as strips and as a lattice on a substrate in-plane direction.

5. The semiconductor device according to claim 2, wherein said insulating film intervening between said first and said second electrode regions is arranged as a bent shape on said substrate plane.

6. The semiconductor device according to claim 1, wherein said electrode regions are arranged as a comb tooth shape.

7. The semiconductor device according to claim 6, wherein said electrode regions are arranged as a comb tooth shape where said ends of said teeth are uneven.

8. The semiconductor device according to claim 7, wherein said lower electrode comprises first and second electrode regions having a comb tooth shape where said ends of said teeth are uneven, and said insulating film intervening between said first and said second electrode regions is arranged as a bent shape on said substrate plane.

9. The semiconductor device according to claim 1, wherein a minimum distance between an end of one of said electrode regions and an end of another of said electrode regions is 0.2 µm or less.

10. The semiconductor device according to claim 1, wherein said capacitor film is formed over said lower electrode and said interconnect and acts as a diffusion barrier film for said interconnect.

11. The semiconductor device according to claim 1, further comprising an insulating diffusion barrier film formed over said interconnect and said capacitor film, wherein said upper electrode is formed over said diffusion barrier film.

12. A semiconductor device according to claim 1, wherein said insulating film comprises a plurality of first portions elongated in one direction and a plurality of shorter second portions elongated in another direction that connects said plurality of first portions, and wherein said insulating film is enclosed by said lower electrodes in plan view.

13. A semiconductor device according to claim 12, wherein said another direction is perpendicular to said one direction.

* * * * *